(12) United States Patent
Oota et al.

(10) Patent No.: US 8,615,027 B2
(45) Date of Patent: Dec. 24, 2013

(54) LASER DIODE, OPTICAL DISK DEVICE AND OPTICAL PICKUP

(75) Inventors: Makoto Oota, Miyagi (JP); Hiroyuki Yokoyama, Miyagi (JP); Masaru Kuramoto, Kanagawa (JP); Masao Ikeda, Kanagawa (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 12/502,564

(22) Filed: Jul. 14, 2009

(65) Prior Publication Data
US 2010/0020838 A1 Jan. 28, 2010

(30) Foreign Application Priority Data
Jul. 23, 2008 (JP) ................................. 2008-189265

(51) Int. Cl.
*H01S 5/00* (2006.01)
(52) U.S. Cl.
USPC ...................... 372/45.013; 372/43.01; 372/64
(58) Field of Classification Search
USPC .................................... 372/43.01, 45.013, 64
See application file for complete search history.

(56) References Cited

U.S. PATENT DOCUMENTS

| | | | | |
|---|---|---|---|---|
| 5,802,084 | A * | 9/1998 | Bowers et al. ................... | 372/18 |
| 6,519,272 | B1 * | 2/2003 | Baliga et al. ................ | 372/49.01 |
| 6,807,213 | B1 * | 10/2004 | Shimoyama et al. ...... | 372/49.01 |
| 6,928,097 | B2 * | 8/2005 | Chida ......................... | 372/46.01 |
| 7,103,079 | B2 * | 9/2006 | McInerney et al. ........ | 372/38.02 |
| 7,542,500 | B2 * | 6/2009 | Takayama et al. ........ | 372/50.121 |
| 2004/0105474 | A1 * | 6/2004 | Ohkubo et al. ................. | 372/46 |
| 2004/0233957 | A1 * | 11/2004 | Ito et al. ........................... | 372/46 |
| 2005/0157767 | A1 * | 7/2005 | Watanabe ....................... | 372/43 |
| 2006/0222024 | A1 * | 10/2006 | Gray et al. ...................... | 372/18 |
| 2010/0246613 | A1 * | 9/2010 | Hasegawa ....................... | 372/20 |

FOREIGN PATENT DOCUMENTS

| | | |
|---|---|---|
| JP | 03-074889 | 3/1991 |
| JP | 04-215489 | 8/1992 |
| JP | 05335691 | * 12/1993 |
| JP | 2000-216482 | 8/2000 |
| JP | 2000-236136 | 8/2000 |
| JP | 2003-060290 | 2/2003 |
| JP | 2003-060303 | 2/2003 |
| JP | 2003-101139 | 4/2003 |
| JP | 2004-186678 | 7/2004 |
| JP | 2005-012178 | 1/2005 |

OTHER PUBLICATIONS

J.N. Walpole, et. al., "High-power strained-layer InGaAs/AlGaAs tapered traveling wave amplifier", Appl. Phys. Lett. 61 (7), Aug. 17, 1992, pp. 740-742.*

(Continued)

*Primary Examiner* — Jessica Stultz
*Assistant Examiner* — Delma R Forde
(74) *Attorney, Agent, or Firm* — Dentons US LLP

(57) ABSTRACT

A laser diode capable of performing self-pulsation operation, and capable of sufficiently reducing the coherence of laser light and stably obtaining low-noise laser light is provided. A laser diode includes: a laser chip including at least one laser stripe which extends in a resonator length direction between a first end surface and a second end surface opposed to each other, in which the laser stripe includes a gain region and a saturable absorption region in the resonator length direction, and the width of the laser stripe in the saturable absorption region is larger than the width of the laser stripe in the gain region.

7 Claims, 8 Drawing Sheets

(56) References Cited

OTHER PUBLICATIONS

V.Z. Tronciu et al.; A theoretical and experimental investigation of the dynamics of tandem blue-violet lasers; Optics Communications 235; 2004; 409-414.

Japanese Office Action issued on May 15, 2012, in connection with counterpart JP Application No. 2008-189265.

Japanese Office Action for Japanese patent No. 2008-189265 dated Oct. 30, 2012.

* cited by examiner

LASER DIODE, OPTICAL DISK DEVICE AND OPTICAL PICKUP

BACKGROUND OF THE INVENTION

1. Field of the Invention

The present invention relates to a laser diode, an optical disk device and an optical pick-up, and more specifically to, for example, a laser diode suitably used as a low-noise light source, and an optical device and an optical pick-up each of which uses the laser diode as a light source.

2. Description of the Related Art

Laser diodes are used as light sources of optical disk devices which read information from optical disks such as CDs (compact discs) and DVDs (digital versatile discs). In such a laser diode, light reflected by an optical disk to be returned to the laser diode, that is, so-called feedback light disturbs the oscillation state of the laser diode, thereby to cause noises. As a heretofore known technique of reducing feedback light-induced noises, a laser diode performing self-pulsation operation is effective. The principle of such a laser diode is to reduce the coherence of laser light to prevent disturbance of the laser diode caused by feedback light.

As a laser diode intended for self-pulsation operation, a two-electrode laser diode is known as described in, for example, Japanese Unexamined Patent Application Publication No. 2004-186678 and V. Z. Tronciu et al., Opt. Commun. 235 (2004) 409-414. FIGS. 9A and 9B illustrate an example of the configuration of a two-electrode laser diode in related art. In this case, FIG. 9A illustrates a plan view, and FIG. 9B illustrates a sectional view taken along line X-X of FIG. 9A.

As illustrated in FIGS. 9A and 9B, the two-electrode laser diode includes a laser stripe (a waveguide) 101 which extends throughout the length in a resonator length direction between a pair of parallel end surfaces 100a and 100b opposed to each other of a rectangular laser chip 100. The laser stripe 101 has a uniform width throughout its length. The laser chip 100 includes a semiconductor layer 103 forming a laser structure on an electrically conductive semiconductor substrate 102. The semiconductor layer 103 includes an active layer as well as an n-side cladding layer, a p-side cladding layer or the like (not illustrated). A section on a side close to the end surface 100a of the laser stripe 101 is a gain region 104, and a section on a side close to the end surface 100b is a saturable absorption region 105. The gain region 104 is formed so as to have a larger length than that of the saturable absorption region 105. Electrodes 106 and 107 are arranged on the gain region 104 and the saturable absorption region 105, respectively. A region between the electrodes 106 and 107 is a current non-injection region (an electrode separation region) 108. An electrode 109 is arranged on a back surface of the laser chip 100, that is, a back surface of the semiconductor substrate 102.

In the two-electrode laser diode with the above-described configuration, when a forward bias voltage is applied between the electrodes 106 and 109 arranged in upper and lower sections of the gain region 104, respectively, to inject a direct current, laser oscillation is performed. Moreover, when a reverse bias voltage is applied between the electrodes 107 and 109 arranged in upper and lower sections of the saturable absorption region 105, respectively, self-pulsation operation is performed.

SUMMARY OF THE INVENTION

As described above, in an optical disk device, a reduction in coherence of laser light is essentially desired. However, according to studies by the inventors of the present invention, in the above-described two-electrode laser diode in related art, even if self-pulsation operation is performed, the coherence of laser light is not sufficiently reduced. Thereby, the power region of available laser light or the design of optical disks are limited, so it is practically difficult to apply the above-described two-electrode laser diode in related art to a light source of the optical disk device.

It is desirable to provide a laser diode capable of performing self-pulsation operation, as well as capable of sufficiently reducing the coherence of laser light and stably obtaining low-noise laser light.

It is also desirable to provide an optical disk device and an optical pick-up using the above-described laser diode as a light source.

According to a first embodiment of the invention, there is provided a laser diode including: a laser chip including at least one laser stripe which extends in a resonator length direction between a first end surface and a second end surface opposed to each other, in which the laser stripe includes a gain region and a saturable absorption region in the resonator length direction, and the width of the laser stripe in the saturable absorption region is larger than the width of the laser stripe in the gain region.

According to a first embodiment of the invention, there is provided an optical disk device including: a laser diode as a light source, in which the laser diode includes a laser chip including at least one laser stripe which extends in a resonator length direction between a first end surface and a second end surface opposed to each other, the laser stripe includes a gain region and a saturable absorption region in the resonator length direction, and the width of the laser stripe in the saturable absorption region is larger than the width of the laser stripe in the gain region.

According to a first embodiment of the invention, there is provided an optical pick-up including: a laser diode as a light source, in which the laser diode includes a laser chip including at least one laser stripe which extends in a resonator length direction between a first end surface and a second end surface opposed to each other, the laser stripe includes a gain region and a saturable absorption region in the resonator length direction, and the width of the laser stripe in the saturable absorption region is larger than the width of the laser stripe in the gain region.

In the laser diode, the optical disk device and the optical pick-up according to the first embodiment of the invention, the length of the saturable absorption region is typically, but not exclusively, smaller than the length of the gain region.

As one typical example, the gain region is arranged on a side close to the first end surface, and the saturable absorption region is arranged on a side close to the second end surface. As another typical example, the saturable absorption regions are arranged on a side close the first end surface and a side close to the second end surface, and the gain region is arranged between the saturable absorption regions. As a still another example, the gain regions are arranged on a side close to the first end surface and a side close to the second end surface, and the saturable absorption region is arranged between the gain regions. The gain region and the saturable absorption region are typically arranged adjacent to each other with a current non-injection region in between.

The gain region and the saturable absorption region are operable independently of each other, and to do so, electrodes are arranged on the gain region and the saturable absorption region, respectively, so as to be separated from each other. During operation of the laser diode, typically, a forward bias voltage is applied to the gain region to inject a direct current to the gain region, and if necessary, in addition to the direct current, an alternating current or a high-frequency current is injected into the gain region. A reverse bias voltage or a bias of 0 is applied to the saturable absorption region.

In the case where the laser stripe has a ridge shape, that is, in the case where the laser stripe is a ridge stripe (a ridge waveguide), if necessary, the lateral refractive index step $\Delta n$ of the laser stripe in the gain region may be different from that in the saturable absorption region. For example, the lateral refractive index step $\Delta n$ in the gain region is larger than that in the saturable absorption region. In this case, the lateral refractive index step of the laser stripe means a difference between the refractive index in a laser stripe section and the refractive index in sections on both sides of the laser stripe. To have different lateral refractive index steps $\Delta n$ in the gain region and the saturable absorption region, for example, the ridges in the gain region and the saturable absorption region have different heights, and the material of a dielectric film (an insulating film), a light absorbing film, a semiconductor film or the like formed on both sides of the ridges in the gain region is different from that in the saturable absorption region.

The laser chip may have only one laser stripe or a plurality of laser stripes between the first end surface and the second end surface, and the number of laser stripes is appropriately determined depending on the application of the laser diode or the like.

The laser chip includes a semiconductor layer (for example, an n-side cladding layer, an active layer, a p-side cladding layer, a contact layer or the like) forming a laser structure. The material of the semiconductor layer forming the laser structure is not specifically limited, and is appropriately selected depending on the wavelength of light to be extracted from the laser diode. More specifically, a Group III-V compound semiconductor such as a GaN-based semiconductor, a GaAs-based semiconductor or a GaInP-based semiconductor, or a Group II-VI compound semiconductor such as ZnSe may be used.

The optical disk device according to the first embodiment of the invention includes an optical disk device for playing (reading) only, an optical disk device for recording (writing) only, and an optical disk device for reproducing and recording, and any reproducing and/or recording mode may be used. The optical disk device according to the first embodiment of the invention includes a reproducing optical system and/or a recording optical system. The optical pick-up according to the first embodiment of the invention is suitably used in such an optical disk device.

According to a second embodiment of the invention, there is provided a laser diode including: a laser chip including at least one laser stripe with a ridge shape extends in a resonator length direction between a first end surface and a second end surface opposed to each other, in which the laser stripe includes a gain region and a saturable absorption region in the resonator length direction, and a lateral refractive index step in the gain region is larger than a lateral refraction index step in the saturable absorption region.

According to a second embodiment of the invention, there is provided an optical disk device including: a laser diode as a light source, in which the laser diode includes at least one laser stripe with a ridge shape which extends in a resonator length direction between a first end surface and a second end surface opposed to each other, the laser stripe includes a gain region and a saturable absorption region in the resonator length direction, and a lateral refractive index step in the gain region is larger than a lateral refraction index step in the saturable absorption region.

According to a second embodiment of the invention, there is provided an optical pick-up including: a laser diode as a light source, in which the laser diode includes at least one laser stripe which extends in a resonator length direction between a first end surface and a second end surface opposed to each other, the laser stripe includes a gain region and a saturable absorption region in the resonator length direction, and a lateral refractive index step in the gain region is larger than a lateral refraction index step in the saturable absorption region.

In the laser diode, the optical disk device and the optical pick-up according to the second embodiment of the invention, in order for the gain region to have a larger lateral refractive index step than that in the saturable absorption region, for example, the ridges in the gain region and the saturable absorption region have different heights, and the material of a dielectric film (an insulating film) a light absorbing film, a semiconductor film or the like formed on both sides of the ridge in the gain region is different from that in the saturable absorption region. The length of the saturable absorption region is typically, but not exclusively, smaller than the length of the gain region.

As one typical example, the gain region is arranged on a side close to the first end surface, and the saturable absorption region is arranged on a side close to the second end surface. As another typical example, the gain region is arranged on each of sides close to the first end surface and the second end surface, and the saturable absorption region is arranged between the saturable absorption regions. As a still another example, the saturable absorption region is arranged on each of sides close to the first end surface and the second end surface, and the gain region is arranged between the saturable absorption regions. The gain region and the saturable absorption region are typically arranged adjacent to each other with a current non-injection region in between.

The gain region and the saturable absorption region are operable independently of each other, and to do so, electrodes are included on the gain region and the saturable absorption region, respectively, so as to be separated from each other. During operation of the laser diode, typically, a forward bias voltage is applied to the gain region to inject a direct current to the gain region, and if necessary, in addition to the direct current, an alternating current or a high-frequency current is injected into the gain region. A reverse bias voltage or a bias of 0 is applied to the saturable absorption region.

The laser chip may have only one laser stripe or a plurality of laser stripes between the first end surface and the second end surface, and the number of laser stripes is appropriately determined depending on the application of the laser diode or the like.

Unless contrary to the nature of the invention, descriptions of the laser diode, the optical disk device and the optical pick-up according to the first embodiment of the invention other than described above may be applied to the laser diode, the optical disk device and the optical pick-up according to the second embodiment of the invention.

As described above, in the laser diode, the optical disk device and the optical pick-up according to the first embodiment of the invention and the laser diode, the optical disk device and the optical pick-up according to the second embodiment of the invention, the laser stripe includes the gain region and the saturable absorption region in the resonator length direction, thereby self-pulsation operation may be performed. Moreover, when the width of the laser stripe in the saturable absorption region is larger than the width of the laser stripe in the gain region, or when the lateral refractive index step in the gain region is larger than the lateral refractive index step in the saturable absorption region, during self-pulsation operation, the light density in the gain region is higher than that in the saturable absorption region. In a region with high light density, a self-phase modulation effect as a third-order nonlinear optical effect is strongly produced. Thereby, the broadening of a longitudinal-mode the light spectrum during the self-pulsation operation is increased to reduce the coherence time, so the coherence of laser light is sufficiently reduced.

According to the first and second embodiments of the invention, a laser diode capable of performing self-pulsation operation, and capable of sufficiently reducing the coherence of laser light and stably obtaining low-noise laser light is achievable. Moreover, when such a superior laser diode is used as a light source of an optical pick-up, a high-performance optical disk device is achievable.

Other and further objects, features and advantages of the invention will appear more fully from the following description.

DETAILED DESCRIPTION OF THE PREFERRED EMBODIMENTS

Preferred embodiments will be described in detail below referring to the accompanying drawings.

First, a two-electrode laser diode according to a first embodiment of the invention will be described below.

Figure 1A:
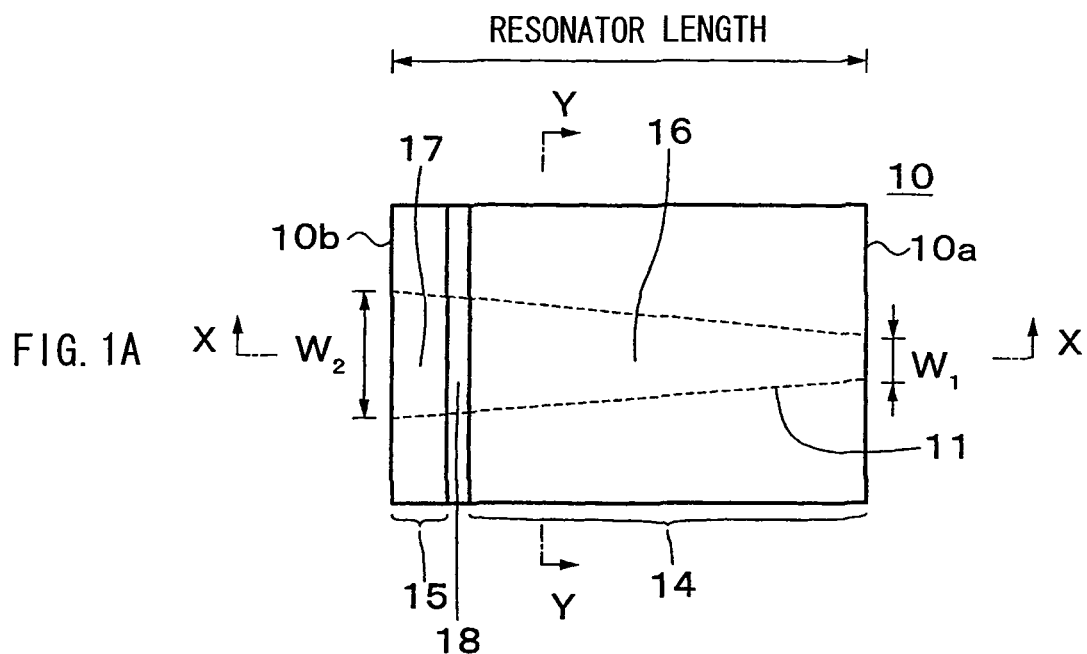
FIGS. 1A and 1B are a plan view and a sectional view illustrating a two-electrode laser diode according to a first embodiment of the invention.
Figure 1B:
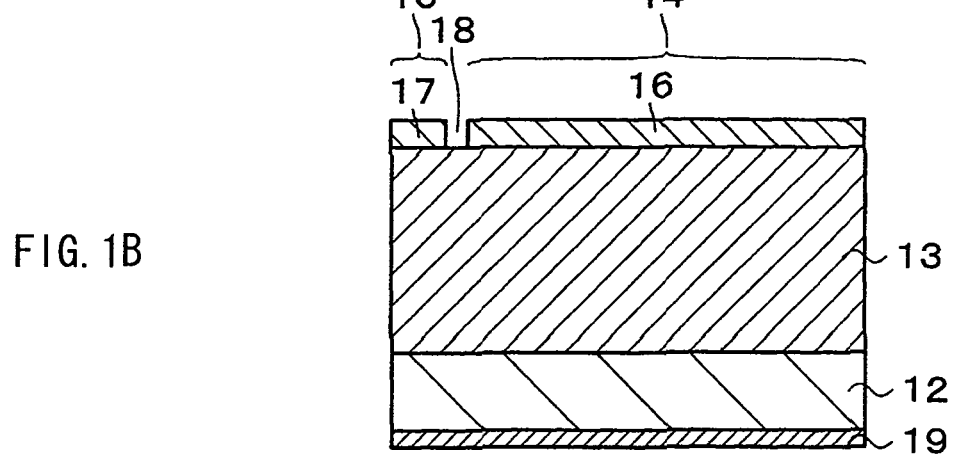

FIGS. 1A and 1B illustrate the two-electrode laser diode, and FIG. 1A is a plan view, and FIG. 1B is a sectional view taken along line X-X (a central line of a laser stripe) of FIG. 1A.

As illustrated in FIGS. 1A and 1B, the two-electrode laser diode includes a laser stripe 11 which extends throughout the length in a resonator length direction between a pair of parallel end surfaces 10a and 10b opposed to each other of a rectangular laser chip 10. The laser chip 10 includes a semiconductor layer 13 forming a laser structure on an electrically conductive semiconductor substrate 12. The semiconductor layer 13 includes an active layer as well as an n-side cladding layer, a p-side cladding layer or the like (not illustrated). A section on a side close to the end surface 10a of the laser stripe 11 is a gain region 14, and a section on a side close to the end surface 10b of the laser stripe 11 is a saturable absorption region 15. Electrodes 16 and 17 are arranged on the gain region 14 and the saturable absorption region 15, respectively. A region between the electrodes 16 and 17 is a current non-injection region (an electrode separation region) 18. An electrode 19 is arranged on a back surface of the laser chip 10, that is, a back surface of the semiconductor substrate 12.

The width of the laser stripe 11 is linearly increased from a width $W_1$ on the end surface 10a to a width $W_2$ ($W_2 > W_1$) on the end surface 10b in a direction from the end surface 10a to the end surface 10b of the laser chip 10. Therefore, in this case, the width of the laser stripe 11 in the saturable absorption region 15 is larger than the width of the laser stripe 11 in the gain region 14. Moreover, the length of the gain region 14 is larger than the length of the saturable absorption region 15.

With regard to reflectivity of the end surfaces 10a and 10b, a heretofore known end surface coat film (not illustrated) is formed so that the end surface 10a has lower reflectivity than the reflectivity of the end surface 10b.

For example, the dimensions of components of the two-electrode laser diode are as follows, but the dimensions are not specifically limited thereto.

Length of gain region 14 (length of electrode 16): 500 μm

Length of saturable absorption region 15 (length of electrode 17): 20 μm

Length of current non-injection region 18 (a space between electrodes 16 and 17): 5 μm Width $W_1$ of laser strip 11 on end surface 10a: 1.4 μm Width $W_2$ of laser stripe 11 on end surface 10b: 3 μm The material of the semiconductor layer 13 forming the laser structure is not specifically limited, and is appropriately selected according to the central wavelength of laser light to be extracted from the two-electrode laser diode. More specifically, examples of the material include a GaN-based semiconductor, a GaAs-based semiconductor, a GaInP-based semiconductor, a ZnSe-based semiconductor and the like. Moreover, the laser structure is not specifically limited, and any of various heretofore known laser structures may be used.

Figure 2:
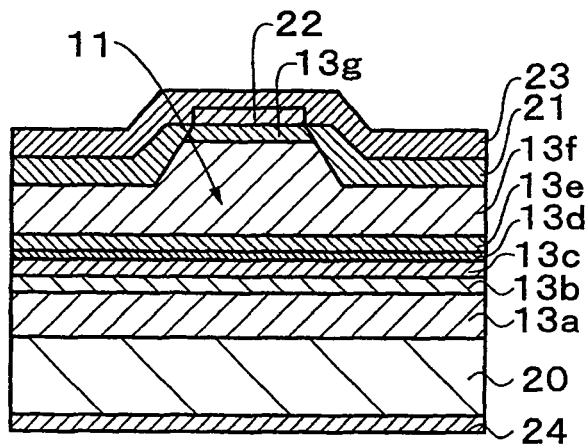
FIG. 2 is a sectional view of the two-electrode laser diode taken along line Y-Y of FIG. 1A.

An example of a sectional configuration vertical to the resonator length direction of the laser chip 10 will be described below. In this case, the case where the semiconductor layer 13 is made of a GaN-based semiconductor, that is, the case where the two-electrode laser diode is a GaN-based laser diode will be described below. FIG. 2 is a sectional view taken along line Y-Y of FIG. 1A, that is, an example of a sectional view of the gain region 14. The sectional configuration of the saturable absorption region 15 has the same configuration as that of the gain region 14.

As illustrated in FIG. 2, in this example, the semiconductor layer 13 is formed by laminating an n-type AlGaN cladding layer 13a, an n-type GaN layer 13b, for example, an undoped $Ga_{1-x}In_xN$ (well layer)/$Ga_{1-y}In_yN$ (barrier layer, x>y) multiple quantum well structure active layer 13c, a p-type AlGaN electronic barrier layer 13d, a p-type GaN layer 13e, a p-type GaN/AlGaN superlattice cladding layer 13f and a p-type GaN contact layer 13g in order on an n-type GaN substrate 20 as a semiconductor substrate 12. A ridge section is formed in an upper section of the p-type GaN/AlGaN superlattice cladding layer 13f and the p-type GaN contact layer 13g, and the laser stripe 11 is a ridge stripe.

For example, an insulating film 21 including a SiO$_2$ film and a Si film arranged on the SiO$_2$ film is formed on a side surface of the laser stripe 11 and sections on both sides of the laser stripe 11 of the p-type GaN/AlGaN superlattice cladding layer 13f. A p-side electrode 22 is formed on the laser stripe 11 so as to electrically contact the p-type GaN contact layer 13g. For example, but not exclusively, the p-side electrode 22 is made of Pd.

A pad electrode 23 is formed over the p-side electrode 22 and the insulating film 21 so as to electrically contact the p-side electrode 22. As the pad electrode 23, for example, an electrode with a Ti/Pt/Au structure is used, and the thicknesses of a Ti film, a Pt film and a Au film are, for example, but not exclusively, 15 nm, 50 nm and 300 nm, respectively. On the other hand, an n-side electrode 24 as the electrode 19 is formed on a back surface of the n-type GaN substrate 20 so as to electrically contact the n-type GaN substrate 20. As the n-side electrode 24, for example, an electrode with a Ti/Pt/Au structure is used, and the thicknesses of a Ti film, a Pt film and a Au film are, for example, but not exclusively, 15 nm, 50 nm and 300 nm, respectively.

As an example of the thickness of the GaN-based semiconductor layer forming the laser structure, the n-type AlGaN cladding layer 13a has a thickness of 1200 nm, the n-type GaN layer 13b has a thickness of 12 nm, the well layer of the active layer 13c has a thickness of 3.5 nm (with a well number of 3), the barrier layer of the active layer 13c has a thickness of 7 nm, the p-type AlGaN electronic barrier layer 13d has a thickness of 10 nm, the p-type GaN layer 13e has a thickness of 12.3 nm, and the p-type GaN/AlGaN superlattice cladding layer 13f has a thickness of 400 nm. Moreover, the Al composition of the n-type AlGaN cladding layer 13a is, for example, 0.05, the Al composition of the p-type AlGaN electronic barrier layer 13d is, for example, 0.2, and the Al composition of the AlGaN layer of the p-type GaN/AlGaN superlattice cladding layer 13f is, for example, 0.08.

Figure 3:
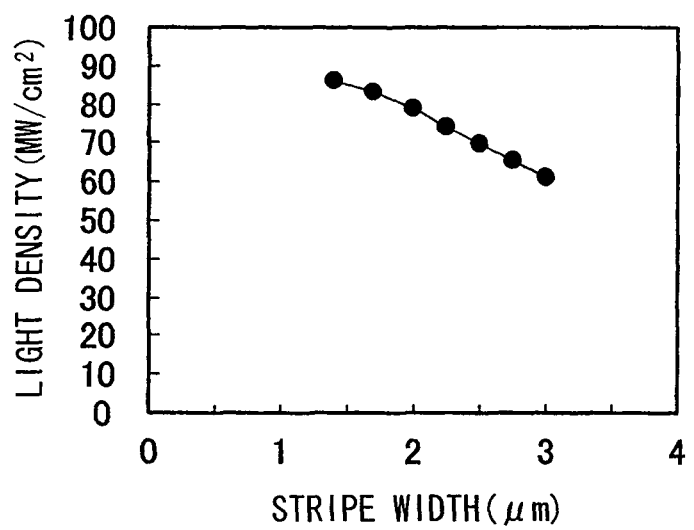
FIG. 3 is a diagram illustrating changes in light density with the width of a stripe.

FIG. 3 illustrates an example of changes in light intensity in the laser stripe during operation with the width of the laser stripe (a stripe width) in the GaN-based laser diode. A lateral refractive index step $\Delta n$ (a difference in the refractive index in a refractive-index profile in the lateral direction) is $6 \times 10^{-3}$. It is obvious from FIG. 3 that the smaller the stripe width is, the more the light density increases. Therefore, it is clear that in the gain region 14 with a smaller width than that of the saturable absorption region 15, the light density is higher than that in the saturable absorption region 15.

Next, a method of manufacturing the two-electrode laser diode will be described below referring to a GaN-based laser diode with a structure illustrated in FIG. 2 as an example of the two-electrode laser diode.

First, the n-type AlGaN cladding layer 13a, the n-type GaN layer 13b, the active layer 13c, the p-type AlGaN electronic barrier layer 13d, the p-type GaN layer 13e, the p-type GaN/AlGaN superlattice cladding layer 13f and the p-type GaN contact layer 13g are epitaxially grown in order on the n-type GaN substrate 20 by, for example, a metal organic chemical vapor deposition (MOCVD) method to form a structure.

Next, for example, an insulating film (not illustrated) such as a SiO$_2$ film is formed on the whole surface of the p-type GaN contact layer 13g, and then the insulating film is patterned into a predetermined shape by etching. Next, the patterned insulating film is used as an etching mask, and the structure is etched until reaching the middle of a depth in a thickness direction of the p-type GaN/AlGaN superlattice cladding layer 13f by, for example, dry etching such as a reactive ion etching (RIE) method to form a ridge.

Next, for example, the SiO$_2$ film and the Si film are formed in order on the whole surface while the insulating film used as the etching mask remains, and then sections above the laser stripe 11 of these films are selectively etched and removed. Thereby, the insulating film 21 is formed on the side surface of the ridge and sections on both sides of the ridge of the p-type GaN/AlGaN superlattice cladding layer 13f.

Next, for example, as a material for forming the p-side electrode 22, a Pd film in the same planar shape as that of the top surface of the ridge is formed on the ridge, for example, by a liftoff method. Next, a predetermined section of the Pd film is etched and removed by an ion milling method to form the current non-injection region 18, and to form the p-side electrodes 22 on the gain region 14 and the saturable absorption region 15.

Next, a resist pattern (not illustrated) with a stripe shape extending to the current non-injection region 18 and an extension of the current non-injection region 18 is formed by lithography, and then a film for forming the pad electrode 23 is formed on the whole surface, for example, by a vacuum deposition method. Then, the resist pattern is removed together with the film formed on the resist pattern. Thereby, the pad electrodes 23 are formed on the p-side electrodes 22. Next, if necessary, the n-type GaN substrate 20 is polished from the back surface thereof to reduce the thickness of the n-type GaN substrate 20 to a predetermined thickness. Then, the n-side electrode 23 is formed on the back surface of the n-type GaN substrate 20.

Next, the n-type GaN substrate 20 in which the laser structure is formed as described above is processed into a bar shape by cleavage or the like to form the end surfaces 10a and 10b, and end surface coat films are formed on the end surfaces 10a and 10b by a heretofore known technique, and then the bar is divided into chips. Thereby, the laser chip 10 is formed, and the desired two-electrode type GaN-based laser diode is manufactured.

Next, operation of the two-electrode laser diode will be described below.

In the gain region 14, a forward bias voltage is applied between the electrodes 16 and 19 to inject a direct current, and in addition, a high-frequency voltage is applied to inject a high-frequency current (in the case where high-frequency superposition is performed). In the saturable absorption region 15, a reverse bias voltage or 0 V is applied between the electrodes 17 and 19. Thus, the two-electrode laser diode performs self-pulsation operation.

In this case, the width of the laser stripe 11 in the gain region 14 is smaller than the width of the laser stripe 11 in the saturable absorption region 15, so the light density in the gain region 14 is higher than that in the saturable absorption region 15. Thereby, in the gain region 14, a self-phase modulation effect is strongly produced. Therefore, in the two-electrode laser diode, compared to a two-electrode laser diode in related art, even if an equivalent light output is used, the broadening of a longitudinal-mode light spectrum during self-pulsation operation is increased more. As a result, the coherence time of laser light is reduced, so the coherence of the laser light is largely reduced, and the occurrence of feedback light noises when reading information from an optical disk is prevented more effectively.

As described above, in the first embodiment, a two-electrode laser diode capable of performing self-pulsation operation and capable of sufficiently reducing the coherence of laser light and stably obtaining low-noise laser light is achieved. Therefore, the two-electrode laser diode is suitably used as a light source for an optical disk device, because the limit on the power region of available laser light or the design of optical disk is largely relaxed. A necessary amount of reduction in coherence for the laser diode depends on the optical path length, the optical system or the like of the optical disk device. However, a larger amount of reduction in the coherence is desirable, because the laser diode is used for a larger number of kinds of optical disk devices.

Next, a three-electrode laser diode according to a second embodiment of the invention will be described below.

Figure 4A:
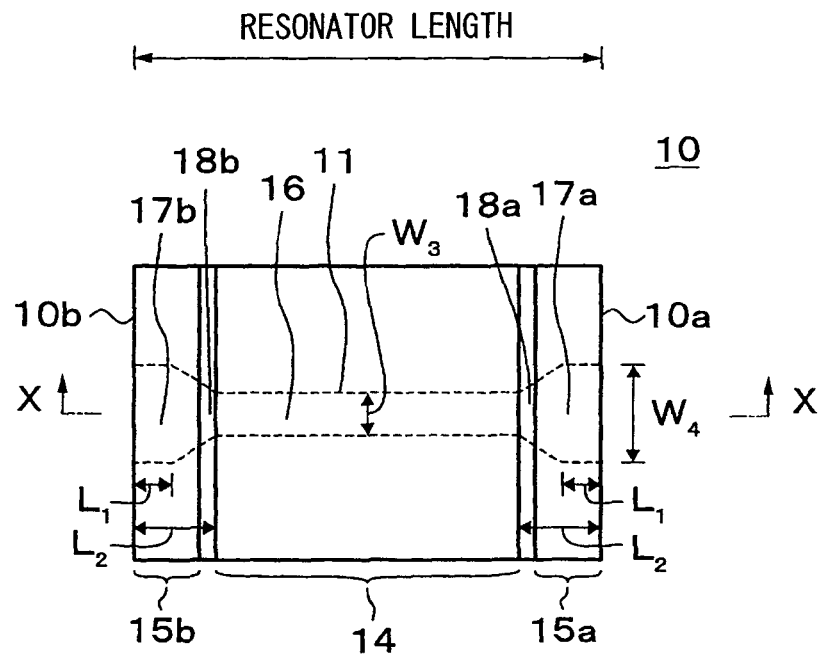
FIGS. 4A and 4B are a plan view and a sectional view illustrating a three-electrode laser diode according to a second embodiment of the invention.
Figure 4B:
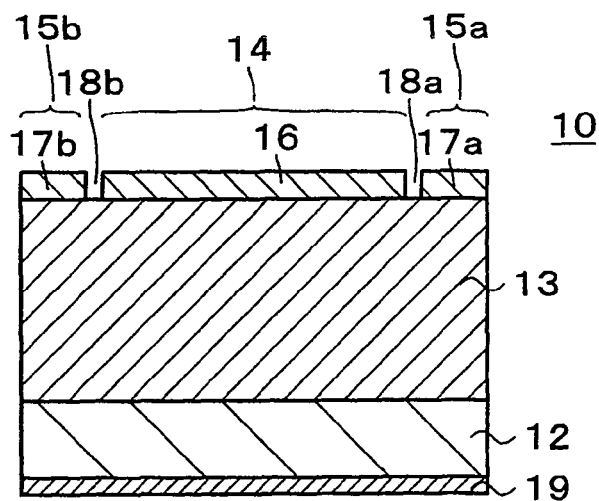

FIGS. 4A and 4B illustrate the three-electrode laser diode, and FIG. 4A is a plan view, and FIG. 4B is a sectional view taken along line X-X (a central line of a laser stripe) of FIG. 4A.

As illustrated in FIGS. 4A and 4B, the three-electrode laser diode includes the laser stripe 11 which extends throughout the length in a resonator length direction between a pair of parallel end surfaces 10A and 10b opposed to each other of the rectangular laser chip 10. The laser chip 10 includes the semiconductor layer 13 forming a laser structure on the electrically conductive semiconductor substrate 12. The semiconductor layer 13 includes an active layer as well as an n-side cladding layer, a p-side cladding layer or the like (not illustrated). A section on a side close to the end surface 10a and a section on a side close to the end surface 10b of the laser stripe 11 are saturable absorption regions 15a and 15b, respectively, and a section between the saturable absorption regions 15a and 15b is the gain region 14. Electrodes 16, 17a and 17b are arranged on the gain region 14 and the saturable absorption regions 15a and 15b, respectively. A region between the electrodes 16 and 17a is a current non-injection region 18a, and a region between the electrodes 16 and 17b is a current non-injection region 18b. The electrode 19 is arranged on the back surface of the laser chip 10, that is, the back surface of the semiconductor substrate 12.

The width of the laser stripe 11 in the gain region 14 is uniform throughout the length of the gain region 14. The laser stripe 11 in each of the saturable absorption regions 15a and 15b has a uniform width $W_4$ ($W_4 > W_3$) in a section from each of the end surfaces 10a and 10b to a point at a distance $L_1$ from each of the end surfaces 10a and 10b, but the width of the laser stripe 11 in each of the saturable absorption regions 15a and 15b is linearly reduced from $W_4$ to $W_3$ in a section from the point at the distance $L_1$ to a point at a distance $L_2$ from each of the end surfaces 10a and 10b. In other words, in this case, the width of the laser stripe 11 in the saturable absorption regions 15a and 15b is larger than that in the gain region 14. Moreover, the length of the gain region 14 is larger than the length of each of the saturable absorption regions 15a and 15b.

The configuration other than described above of the three-electrode laser diode is the same as that of the two-electrode laser diode according to the first embodiment.

Moreover, a method of manufacturing the three-electrode laser diode is the same as the method of manufacturing the two-electrode laser diode according to the first embodiment.

Next, operation of the three-electrode laser diode will be described below.

In the gain region 14, a forward bias voltage is applied between the electrodes 16 and 19 to apply a direct current, and in addition, if necessary, a high-frequency voltage is applied to inject a high-frequency current (in the case where high-frequency superposition is performed). In the saturable absorption regions 15a and 15b, a reverse bias voltage or 0 V is applied between the electrodes 17a and 19 and between the electrodes 17b and 19. Thus, the three-electrode laser diode performs self-pulsation operation.

In this case, the width of the laser stripe 11 in the gain region 14 is smaller than the width of the laser stripe 11 in each of the saturable absorption regions 15a and 15b, so the light density in the gain region 14 is higher than that in the saturable absorption regions 15a and 15b. Thereby, in the gain region 14, the self-phase modulation effect is strongly produced. Therefore, in the three-electrode laser diode, as in the case of the two-electrode laser diode according to the first embodiment, the broadening of a longitudinal-mode light spectrum during self-pulsation operation is increased. As a result, the coherence time of laser light is reduced, so coherence of the laser light is largely reduced, and the occurrence of feedback light noises when reading information from an optical disk is prevented more effectively.

In the second embodiment, the same advantages as those in the first embodiment are obtained.

Next, a three-electrode laser diode according to a third embodiment of the invention will be described below.

Figure 5A:
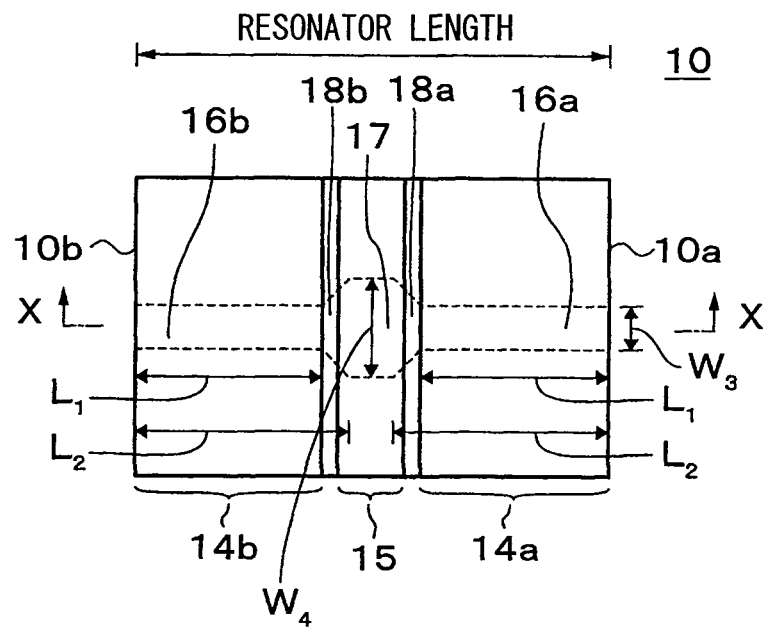
FIGS. 5A and 5B are a plan view and a sectional view illustrating a three-electrode laser diode according to a third embodiment of the invention.
Figure 5B:
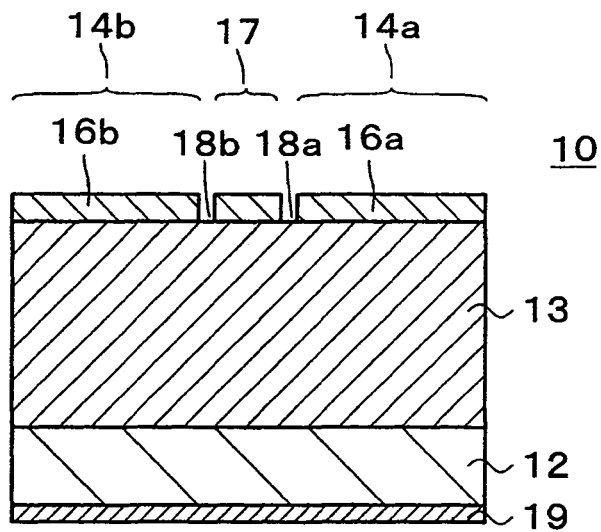

FIGS. 5A and 5B illustrate the three-electrode laser diode, and FIG. 5A is a plan view and FIG. 5B is a sectional view taken along line X-X of FIG. 5A (a central line of a laser stripe).

As illustrated in FIGS. 5A and 5B, the three-electrode laser diode includes the laser stripe 11 which extends throughout the length in a resonator length diction between a pair of parallel end surfaces 10a and 10b opposed to each other of the rectangular laser chip 10. The laser chip 10 includes the semiconductor layer 13 forming a laser structure on the electrically conductive semiconductor substrate 12. The semiconductor layer 13 includes an active layer as well as an n-side cladding layer, a p-side cladding layer or the like (not illustrated). A section on a side close to the end surface 10a and a section on a side close to the end surface 10b of the laser stripe 11 are gain regions 14a and 14b, respectively, and a section between the gain regions 14a and 14b is the saturable absorption region 15. Electrodes 16a, 16b and 17 are arranged on the gain regions 14a and 14b and the saturable absorption region 15, respectively. A region between the electrodes 16a and 17 is a current non-injection region 18a, and a region between the electrodes 16b and 17 is a current non-injection region 18b. The electrode 19 is arranged on the back surface of the laser ship 10, that is, the back surface of the semiconductor substrate 12.

The laser stripe 11 in each of the gain regions 14a and 14b has a uniform width $W_3$ throughout the length of each of the gain region 14a and 14b. The laser stripe 11 in the saturable absorption region 15 has a uniform width $W_4$ ($W_4 > W_3$) in a section between a point at a distance $L_2$ from the end surface 10a and a point at the distance $L_2$ from the end surface 10b, but the width of the laser stripe 11 in the saturable absorption region 15 is linearly reduced from $W_4$ to $W_3$ in a section from the point at the distance $L_2$ to a point at a distance $L_1$ from each of the end surfaces 10a and 10b. In other words, in this case, the width of the laser stripe 11 in the saturable absorption region 15 is larger than that in each of the gain regions 14a and 14b. Moreover, the length of each of the gain regions 14a and 14b is larger than the length of the saturable absorption region 15.

The configuration other than described above of the three-electrode laser diode is the same as that of the two-electrode laser diode according to the first embodiment.

Moreover, a method of manufacturing the three-electrode laser diode is the same as the method of manufacturing the two-electrode laser diode according to the first embodiment.

Next, operation of the three-electrode laser diode will be described below.

In the gain regions 14a and 14b, a forward bias voltage is applied between the electrodes 16a and 19 and between the electrodes 16b and 19 to apply a direct current, and in addition, if necessary, a high-frequency voltage is applied to inject a high-frequency current (in the case where high-frequency superposition is performed). In the saturable absorption region 15, a reverse bias voltage or 0 V is applied between the electrodes 17 and 19. Thus, the three-electrode laser diode performs self-pulsation operation.

In this case, the width of the laser stripe 11 in each of the gain regions 14a and 14b is smaller than the width of the laser stripe 11 in the saturable absorption region 15, so the light density in the gain regions 14a and 14b is higher than that in the saturable absorption region 15. Thereby, in the gain regions 14a and 14b, the self-phase modulation effect is strongly produced. Therefore, in the three-electrode laser diode, as in the case of the two-electrode laser diode according to the first embodiment, the broadening of a longitudinal-mode light spectrum during self-pulsation operation is increased. As a result, the coherence time of laser light is reduced, so the coherence of the laser light is largely reduced, and the occurrence of feedback light noises when reading information from an optical disk is prevented more effectively.

In the third embodiment, the same advantages as those in the first embodiment are obtained.

Next, a two-electrode laser diode according to a fourth embodiment of the invention will be described below.

Figure 6A:
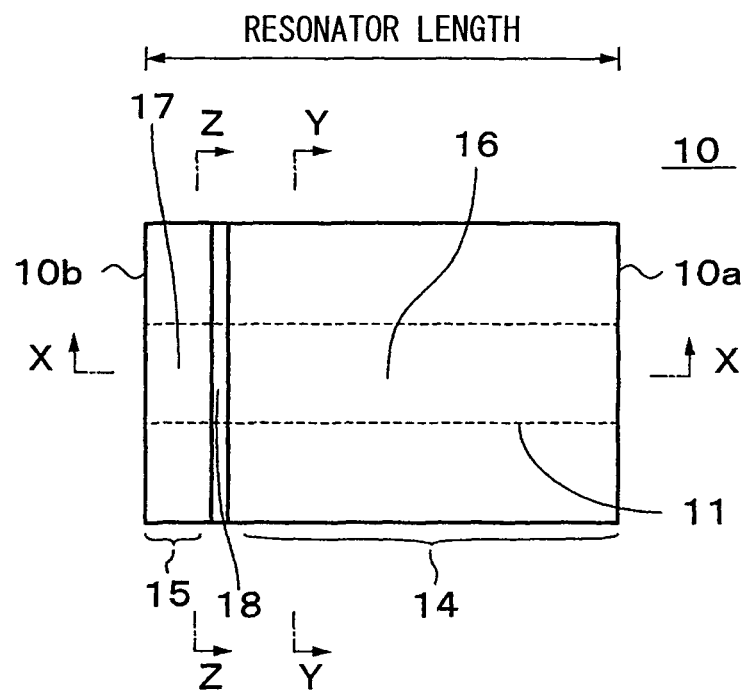
FIGS. 6A and 6B are a plan view and a sectional view illustrating a two-electrode laser diode according to a fourth embodiment of the invention.
Figure 6B:
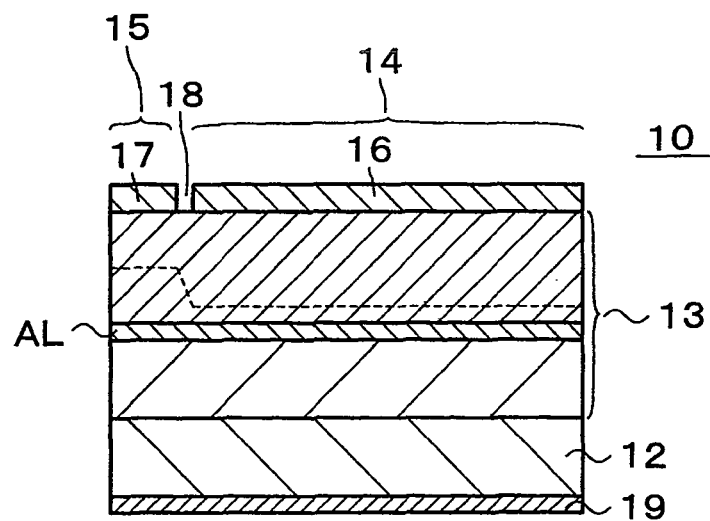
Figure 7A:
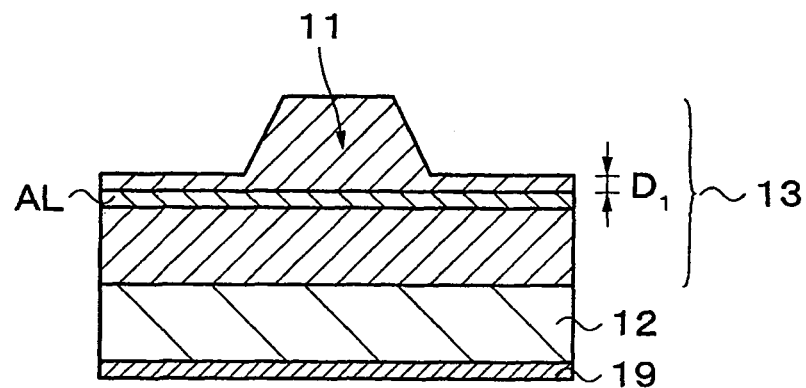
FIGS. 7A and 7B are sectional views illustrating the two-electrode laser diode according to the fourth embodiment of the invention.
Figure 7B:
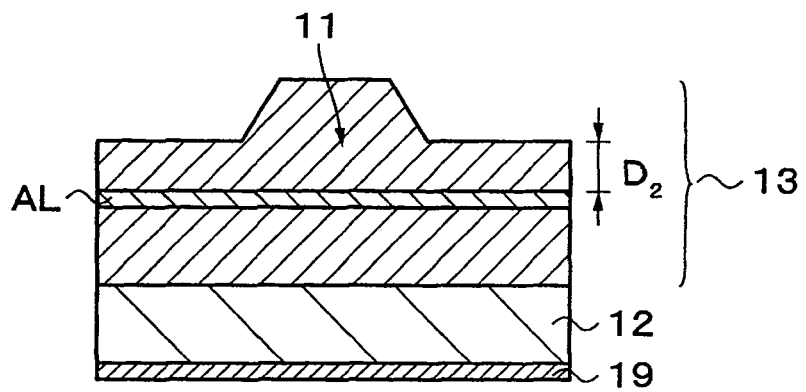

FIGS. 6A, 6B, 7A and 7B illustrate the two-electrode laser diode. FIG. 6A is a plan view, and FIGS. 6B, 7A and 7B are sectional views taken along lines X-X (a central line of a laser stripe), Y-Y and Z-Z of FIG. 6A, respectively.

As illustrated in FIGS. 6A, 6B, 7A and 7B, the two-electrode laser diode includes the laser stripe 11 which extends throughout the length in a resonator length direction between a pair of parallel end surfaces 10a and 10b opposed to each other of the rectangular laser chip 10. In this case, the laser stripe 11 has a ridge shape. In other words, the laser stripe 11 is a ridge stripe. If necessary, a semiconductor layer or an insulating film, for example, a $SiO_2$ film is arranged on sections on both sides of the ridge.

The laser chip 10 includes the semiconductor layer 13 forming a laser structure on the electrically conductive semiconductor substrate 12, and a ridge is formed in an uppermost section of the semiconductor layer 13. In FIG. 6B, a top surface of the semiconductor layer 13 in sections on both sides of the ridge is indicated with a broken line. The semiconductor layer 13 includes an active layer AL as well as an n-side cladding layer, a p-side cladding layer or the like (not illustrated).

A section on a side close to the end surface 10a of the laser stripe 11 is the gain region 14, a section on a side close to the end surface 10b of the laser stripe 11 is the saturable absorption region 15. The electrodes 16 and 17 are arranged on the gain region 14 and the saturable absorption region 15, respectively. A region between the electrodes 16 and 17 is the current non-injection region 18. The electrode 19 is arranged on the back surface of the laser chip 10, that is, the back surface of the semiconductor substrate 12.

The laser stripe 11 has a uniform width throughout the length thereof. Therefore, the width of the laser stripe 11 in the gain region 14 is equal to the width of the laser stripe 11 in the saturable absorption region 15.

In this case, the height of the ridge of the laser stripe 11 in the gain region 14 is different from that in the saturable absorption region 15, and the height of the ridge in the gain region 14 is larger than that in the saturable absorption region 15. In other words, as a distance between a top surface of the semiconductor layer 13 and a top surface of the active layer AL in sections on both sides of the laser stripe 11, the gain region 14 has a distance $D_1$ which is smaller than a distance $D_2$ in the saturable absorption region 15.

Figure 8A:
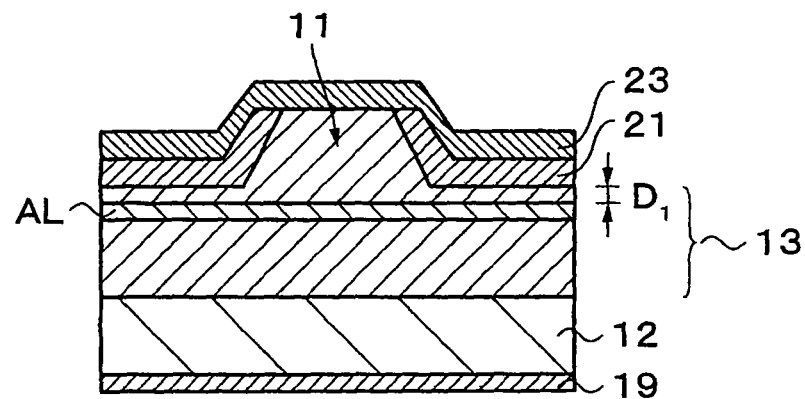
FIGS. 8A and 8B are sectional views illustrating the two-electrode laser diode according to the fourth embodiment of the invention.
Figure 8B:
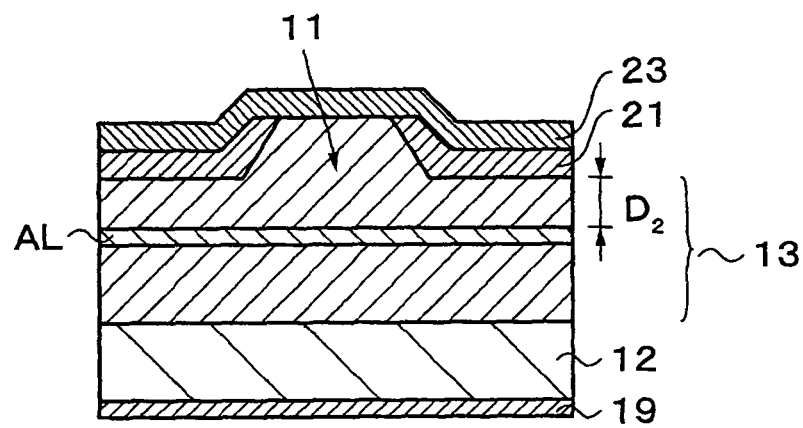
Figure 9A:
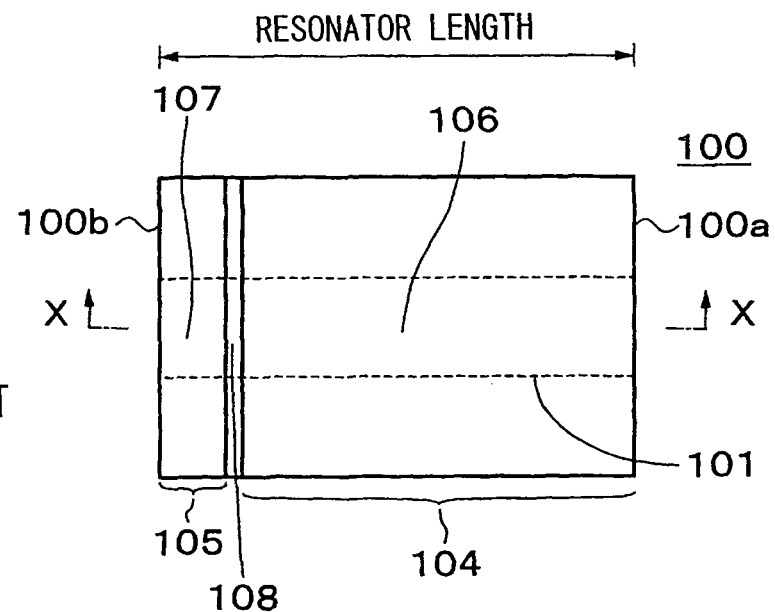
FIGS. 9A and 9B are a plan view and a sectional view illustrating a two-electrode laser diode in related art.
Figure 9B:
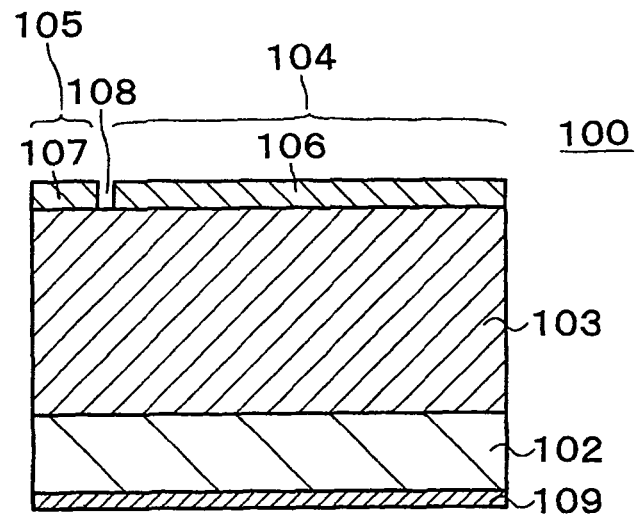

For example, in the case where the two-electrode laser diode is a GaN-based laser diode, as illustrated in FIGS. 8A and 8B, for example, a $SiO_2$ film and an insulating film 21 made of a Si film are formed on a side surface of the ridge and sections on both sides of the ridge of the semiconductor layer 13.

The configuration other than described above of the two-electrode laser diode is the same as that of the two-electrode laser diode according to the first embodiment.

Moreover, a method of manufacturing the two-electrode laser diode is the same as the method of manufacturing the two-electrode laser diode according to the first embodiment.

Next, operation of the two-electrode laser diode will be described below.

In the gain region 14, a forward bias voltage is applied between the electrodes 16 and 19 to apply a direct current, and in addition, if necessary, a high-frequency voltage is applied to inject a high-frequency current (in the case where high-frequency superposition is performed). In the saturable absorption region 15, a reverse bias voltage or 0 V is applied between the electrodes 17 and 19. Thus, the two-electrode laser diode performs self-pulsation operation.

In this case, as the distance between the top surface of the semiconductor layer 13 and the top surface of the active layer AL in sections on both sides of the laser stripe 11, as described above, the gain region 14 has the distance $D_1$ which is smaller than the distance $D_2$ in the saturable absorption region 15. Thereby, a lateral refractive index step $\Delta n$ in the gain region 14 is larger than that in the saturable absorption region 15. Therefore, optical confinement in the gain region 14 is stronger than that in the saturable absorption region 15. As a result, the light density in the gain region 14 is higher than that in the saturable absorption region 15, thereby in the gain region 14, the self-phase modulation effect is strongly produced. Therefore, in the two-electrode laser diode, as in the case of the two-electrode laser diode according to the first embodiment, the broadening of a longitudinal-mode light spectrum during self-pulsation operation is increased. As a result, the coherence time of laser light is reduced, so the coherence of the laser light is largely reduced, and the occurrence of feedback light noises when reading information from an optical disk is prevented more effectively.

In the fourth embodiment, the same advantages as those in the first embodiment are obtained.

Next, a two-electrode laser diode according to a fifth embodiment of the invention will be described below.

The fifth embodiment is a combination of the first embodiment and the fourth embodiment.

More specifically, in the two-electrode laser diode according to the first embodiment, as in the case of the two-electrode laser diode according to the fourth embodiment, the gain region 14 has the distance $D_1$ which is smaller than the distance $D_2$ in the saturable absorption region 15, thereby the two-electrode laser diode according to the fifth embodiment is formed. Thus, the light density in the gain region 14 becomes higher, and the self-phase modulation effect is produced more strongly.

In the fifth embodiment, the same advantages as those in the first embodiment are obtained.

Next, a three-electrode laser diode according to a sixth embodiment will be described below.

The sixth embodiment is a combination of the second embodiment and the fourth embodiment. More specifically, in the three-electrode laser diode according to the second embodiment, as in the case of the two-electrode laser diode according to the fourth embodiment, the gain region 14 has the distance $D_1$ which is smaller than the distance $D_2$ in the saturable absorption regions 15a and 15b, thereby the three-electrode laser diode according to the sixth embodiment is formed, Thus, the light density in the gain region 14 becomes higher, and the self-phase modulation effect is produced more strongly.

In the sixth embodiment, the same advantages as those in the first embodiment are obtained.

Next, a three-electrode laser diode according to a seventh embodiment of the invention will be described below.

The seventh embodiment is a combination of the third embodiment and the fourth embodiment. More specifically, in the three-electrode laser diode according to the third embodiment, as in the case of the two-electrode laser diode according to the fourth embodiment, the gain regions 14a and 14b each have the distance $D_1$ which is smaller than the distance $D_2$ in the saturable absorption region 15, thereby the three-electrode laser diode according to the seventh embodiment is formed. Thus, the light density in the gain regions 14a and 14b becomes higher, and the self-phase modulation effect is produced more strongly.

In the seventh embodiment, the same advantages as those in the first embodiment are obtained.

Although the invention is specifically described referring to the above-described embodiments, the invention is not limited thereto, and may be variously modified.

For example, the values, the configurations, the shapes, the substrates, the processes and the like described in the embodiments are only examples, and any other values, configurations, shapes, substrates, processes and the like may be used.

The present application contains subject matter related to that disclosed in Japanese Priority Patent Application JP 2008-189265 filed in the Japanese Patent Office on Jul. 23, 2008, the entire content of which are hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. A laser diode comprising:
a laser chip including (a) a first electrode, (b) a substrate, (c) a semiconductor region, and (d) a second electrode, the laser chip including at least one laser stripe which extends in a resonator length direction between a first end surface of the laser chip and a second end surface of the laser chip, the first end surface and the second end surface facing in opposite directions, the laser stripe being a ridge formed in an upper part of the semiconductor region,
wherein,
an insulating film is formed on both sides of the ridge on the upper part of the semiconductor region,
the laser stripe includes a gain region and a saturable absorption region in the resonator length direction,
a length of the saturable absorption region is smaller than a length of the gain region,
in plan view, a width of the laser stripe linearly increases along the resonator length direction throughout a length defined from the first end surface at the gain region of the laser chip to the second end surface at the saturable absorption region of the laser chip,
the second electrode is disposed on the ridge of the laser stripe and is shaped in accordance with a shape of the laser stripe having increased width,
the width of the laser stripe in the saturable absorption region is larger than the width of the laser stripe in the gain region, and
the first and second end surfaces are coated such that a reflectivity of the first end surface is lower than a reflectivity of the second end surface.

2. The laser diode according to claim 1, wherein the gain region and the saturable absorption region are operable independently of each other.

3. The laser diode according to claim 2, wherein the second electrode and a third electrode are arranged on the gain region and the saturable absorption region, respectively, so as to be separated from each other.

4. An optical disk device comprising:
a laser diode as a light source,
wherein
the laser diode includes a laser chip including (a) a first electrode, (b) a substrate, (c) a semiconductor region, and (d) a second electrode, the laser chip including at least one laser stripe which extends in a resonator length direction between a first end surface of the laser chip and a second end surface of the laser chip, the first and second end surfaces being opposed to each other, the laser stripe being a ridge formed in an upper part of the semiconductor region,
an insulating film is formed on both sides of the ridge on the upper part of the semiconductor region,
the laser stripe includes a gain region and a saturable absorption region in the resonator length direction,
a length of the saturable absorption region is smaller than a length of the gain region,
in plan view, a width of the laser stripe linearly increases along the resonator length direction throughout a length defined from the first end surface at the gain region of the laser chip to the second end surface at the saturable absorption region of the laser chip,
the second electrode is disposed on the ridge of the laser stripe and is shaped in accordance with a shape of the laser stripe having increased width
the width of the laser stripe in the saturable absorption region is larger than the width of the laser stripe in the gain region, and
the first and second end surfaces are coated such that a reflectivity of the first end surface is lower than a reflectivity of the second end surface.

5. An optical pick-up comprising:
a laser diode as a light source,
wherein
the laser diode includes a laser chip including (a) a first electrode, (b) a substrate, (c) a semiconductor region, and (d) a second electrode, the laser chip including at least one laser stripe which extends in a resonator length direction between a first end surface of the laser chip and a second end surface of the laser chip, the first and second end surfaces being opposed to each other, the laser stripe being a ridge formed in an upper part of the semiconductor region,
an insulating film is formed on both sides of the ridge on the upper part of the semiconductor region,
the laser stripe includes a gain region and a saturable absorption region in the resonator length direction,
a length of the saturable absorption region is smaller than a length of the gain region,
in plan view, a width of the laser stripe linearly increases along the resonator length direction throughout a length defined from the first end surface at the gain region of the laser chip to the second end surface at the saturable absorption region of the laser chip, the second electrode is disposed on the ridge of the laser stripe and is shaped in accordance with a shape of the laser stripe having increased width, the width of the laser stripe in the saturable absorption region is larger than the width of the laser stripe in the gain region, and the first and second end surfaces are coated such that a reflectivity of the first end surface is lower than a reflectivity of the second end surface.

6. The laser diode of claim 1, wherein, the semiconductor region includes at least (a) a first cladding layer, (b) an active layer, and (c) a second cladding layer, and the ridge is formed in an upper section of the first cladding layer.

7. The laser diode of claim 1, wherein the substrate comprises GaN.

\* \* \* \* \*